(12) United States Patent
Park

(10) Patent No.: US 9,362,430 B2
(45) Date of Patent: Jun. 7, 2016

(54) SOLAR CELL AND SOLAR CELL MODULE USING THE SAME

(71) Applicant: Gi Gon Park, Seoul (KR)

(72) Inventor: Gi Gon Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 239 days.

(21) Appl. No.: 14/351,211

(22) PCT Filed: Oct. 12, 2012

(86) PCT No.: PCT/KR2012/008332
§ 371 (c)(1),
(2) Date: Apr. 11, 2014

(87) PCT Pub. No.: WO2013/055157
PCT Pub. Date: Apr. 18, 2013

(65) Prior Publication Data
US 2014/0261620 A1    Sep. 18, 2014

(30) Foreign Application Priority Data

Oct. 13, 2011   (KR) .................. 10-2011-0104743

(51) Int. Cl.
*H01L 31/0224* (2006.01)
*H01L 31/0352* (2006.01)
*H01L 31/032* (2006.01)

(52) U.S. Cl.
CPC .... *H01L 31/0352* (2013.01); *H01L 31/022441* (2013.01); *H01L 31/0322* (2013.01); *Y02E 10/541* (2013.01)

(58) Field of Classification Search
CPC .................. H01L 31/022441; H01L 31/0352; H01L 31/0322

USPC ......................................................... 136/256
See application file for complete search history.

(56) References Cited

U.S. PATENT DOCUMENTS

| 2005/0238803 A1 | 10/2005 | Tremel et al. |
| 2006/0231801 A1 | 10/2006 | Carroll et al. |
| 2008/0145521 A1 | 6/2008 | Guo et al. |
| 2012/0097242 A1 | 4/2012 | Lee |

FOREIGN PATENT DOCUMENTS

| CN | 1871718 A | 11/2006 |
| CN | 101055896 A | 10/2007 |
| EP | 2306468 A1 | 4/2011 |

(Continued)

OTHER PUBLICATIONS

International Search Report in International Application No. PCT/KR2012/008332, filed Oct. 12, 2012.

(Continued)

*Primary Examiner* — Jayne Mershon
(74) *Attorney, Agent, or Firm* — Saliwanchik, Lloyd & Eisenschenk

(57) ABSTRACT

Disclosed are a solar cell and a solar cell module using the same. The solar cell module includes a glass frit provided on a support substrate and including sodium, a first solar cell comprising a first back electrode layer, a first light absorbing layer, and a first front electrode layer which are sequentially arranged on the support substrate, and a second solar cell comprising a second back electrode layer, a second light absorbing layer, and a second front electrode layer which are sequentially arranged on the glass frit. The first solar cell is electrically connected to the second solar cell on the glass frit.

20 Claims, 2 Drawing Sheets

(56) References Cited

FOREIGN PATENT DOCUMENTS

| KR | 10-2010-0109317 A | 10/2010 |
|---|---|---|
| KR | 1020100122604 A | 11/2010 |
| KR | 10-2011-0046195 A | 5/2011 |
| KR | 1020110056631 A | 5/2011 |
| KR | 10-2011-0081674 A | 7/2011 |

OTHER PUBLICATIONS

Office Action dated Sep. 29, 2015 in Chinese Application No. 201280061952.3.

SOLAR CELL AND SOLAR CELL MODULE USING THE SAME

CROSS-REFERENCE TO RELATED APPLICATIONS

This application is the U.S. national stage application of International Patent Application No. PCT/KR2012/008332, filed Oct. 12, 2012, which claims priority to Korean Application No. 10-2011-0104743, filed Oct. 13, 2011, the disclosures of each of which are incorporated herein by reference in their entirety.

TECHNICAL FIELD

The embodiment relates to a solar cell and a solar cell module using the same.

BACKGROUND ART

Recently, the requirement for new renewable energy and the interest of the new renewable energy have been more increased due to the serious environmental pollution and the lack of fossil fuel. In this regard, a solar cell is spotlighted as a pollution-free energy source for solving the future energy problem because it rarely causes environmental pollution and has the semi-permanent life span and there exists infinite resources for the solar cell.

Solar cells may be defined as devices for converting light energy into electric energy by using a photovoltaic effect of generating electrons when light is incident onto a P—N junction diode. The solar cell may be classified into a silicon solar cell, a compound semiconductor solar cell mainly including a group I-III-VI compound or a group III-V compound, a dye-sensitized solar cell, and an organic solar cell according to materials constituting the junction diode.

A solar cell made from CIGS (CuInGaSe), which is one of group I-III-VI Chal-copyrite-based compound semiconductors, represents superior light absorption, higher photoelectric conversion efficiency with a thin thickness, and superior electro-optic stability, so the CIGS solar cell is spotlighted as a substitute for a conventional silicon solar cell.

In general, the efficiency of the CIGS solar cell can be improved by diffusing sodium into a light absorbing layer. Meanwhile, according to the CIGS solar cell of the related art, the sodium may not be sufficiently supplied to the light absorbing layer or the supply of the sodium to the light absorbing layer may not be readily controlled.

The minimum unit of the solar cell is called a cell. In general, one cell generates a very small voltage of about 0.5V to about 0.6V. Therefore, a solar cell module, which is fabricated in the form of a panel by connecting a plurality of cells to each other in series on a substrate to generate voltages in a range of several voltages V to several hundreds of voltages V, is used. FIG. 1 is a sectional view showing a solar cell module according to the related art. Referring to FIG. 1, a front electrode layer 60 of a first cell C1 makes contact with a back electrode layer 21 of a second cell C2, so the first cell C1 is connected to the second cell C2. The front electrode layer 60 of the first cell C1 is abruptly bent in the vertical direction and connected to the back electrode layer 21 of the second cell C2. However, if the front electrode layer 60 is bent, it may interfere with the movement of electrons in the front electrode layer 60, so connection resistance between the cells may be increased.

Further, the support substrate has the thermal expansion coefficient different from that of the solar cell, so that the CIGS solar cell module according to the related art is bent through a heat treatment process in the manufacturing process. Accordingly, the solar cell module is delaminated from the support substrate.

DISCLOSURE OF INVENTION

Technical Problem

The embodiment provides a solar cell and a solar cell module, capable of representing improved photo-electric conversion efficiency while representing an improved bending characteristic.

Solution to Problem

According to the embodiment, there is provided a solar cell module including a glass frit provided on a support substrate and including sodium, a first solar cell comprising a first back electrode layer, a first light absorbing layer, and a first front electrode layer which are sequentially arranged on the support substrate, and a second solar cell comprising a second back electrode layer, a second light absorbing layer, and a second front electrode layer which are sequentially arranged on the glass frit. The first solar cell is electrically connected to the second solar cell on the glass frit.

According to the embodiment, there is provided a method of fabricating a solar cell module. The method includes forming a glass frit including sodium on a support substrate, forming a back electrode layer on the support substrate and the glass frit, forming a light absorbing layer on the back electrode layer, and forming a front electrode layer on the light absorbing layer.

According to the embodiment, there is provided a solar cell including a glass frit provided on a support substrate and including sodium, a back electrode layer provided on the support substrate and the glass frit and having a first height step, a light absorbing layer provided on the back electrode layer and having a second height step, and a front electrode layer provided on the light absorbing layer and having a third height step.

Advantageous Effects of Invention

As described above, according to the solar cell of the embodiment, the glass frit including sodium is formed on the support substrate, so that the sodium contained in the glass frit can be dispersed into the light absorbing layer. Accordingly, the solar cell according to the embodiment can effectively adjust an amount of sodium of the light absorbing layer, so that the photo-conversion efficiency can be improved.

In addition, according to the solar cell of the embodiment, all of the back electrode layer, the light absorbing layer, and the front electrode layer provided on the support substrate can have height steps by the glass frit. When the solar cell module is formed by connecting a plurality of solar cells to each other, the electrodes connecting the solar cells to each other can make contact with each other on the substantially same level by the height step, and the contact area between the connection electrodes can be widened. In addition, the non-active area (NAA) on the support substrate can be reduced. In other words, according to the solar cell module of the embodiment, the contact resistance caused by the bending of the connection electrodes can be reduced, thereby improving the photo-electric efficiency.

According to the solar cell module of the embodiment, the thermal expansion coefficient of the glass frit can be adjusted to be greater than the thermal expansion coefficient of the support substrate. Accordingly, the bending phenomenon of the support substrate caused by the heat treatment process in the manufacturing process can be minimized. Therefore, the delamination between the support substrate and the solar cell module can be prevented.

In addition, according to the solar cell module according to the embodiment, the concave convex pattern is formed by the glass frit. Due to the above structure characteristic, the adhesive strength between the solar cell module and the layer formed on the solar cell module can be improved. Accordingly, the stability and the reliability of the solar cell module can be improved.

MODE FOR THE INVENTION

Figure 1:
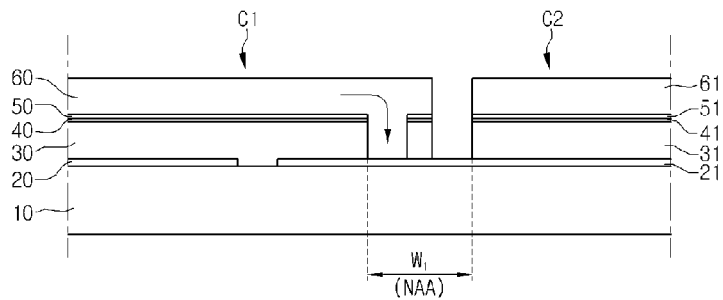
FIG. 1 is a sectional view showing a solar cell according to the related art.

In the description of the embodiments, it will be understood that when a substrate, a layer, a film or an electrode is referred to as being "on" or "under" another substrate, another layer, another film or another electrode, it can be "directly" or "indirectly" on the other substrate, the other layer, the other film, or the other electrode, or one or more intervening layers may also be present. Such a position of the layer has been described with reference to the drawings. The size of the elements shown in the drawings may be exaggerated for the purpose of explanation and may not utterly reflect the actual size.

Figure 2:
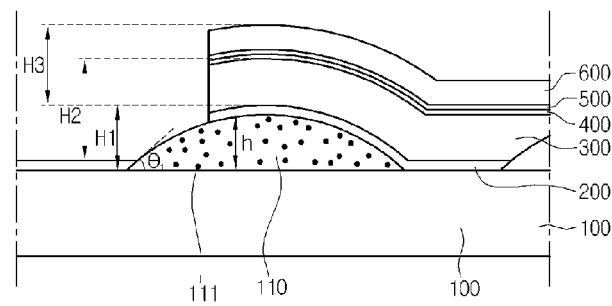
FIG. 2 is a sectional view showing a solar cell according to the embodiment.

FIG. 2 is a sectional view showing the solar cell according to the embodiment. Referring to FIG. 2, the solar cell according to the embodiment includes a support substrate 100, a glass frit 110, a back electrode layer 200, a light absorbing layer 300, a buffer layer 400, a high resistance buffer layer 500, and a front electrode layer 600.

The support substrate 100 supports the glass frit 110, the back electrode layer 200, the light absorbing layer 300, the buffer layer 400, the high resistance buffer layer 500, and the front electrode layer 600.

The support substrate 100 has a high strength. In addition, the support substrate 100 may be rigid or flexible. For example, the support substrate 100 may include a glass substrate, a ceramic substrate, such as alumina, a stainless steel substrate, a titanium substrate or a polymer substrate. In addition, since the solar cell according to the embodiment includes an additional sodium supplying layer (glass frit 110) on the support substrate 100, the support substrate 100 may not include impurities such as sodium.

The glass frit 110 is provided on the support substrate 100. The glass frit 110 may directly make contact with the support substrate 100.

The glass frit 110 may be sintered through heat treatment. The glass frit 110 may various materials generally used by those skilled in the art. For example, the glass frit 110 may include $SiO_2$-based material, $SiO_2$—ZnO (Si—Zn—O)-based material, $SiO_2$—$B_2O_3$ (Si—B—O)-based material, and $SiO_2$—$Bi_2O_3$ (Si—Bi—O)-based material, but the embodiment is not limited thereto. In this case, the $SiO_2$-based material refers to $SiO_2$ which is a main component of the glass frit 110. The $SiO_2$—ZnO-based material includes $SiO_2$, which is a main component of the glass frit, and ZnO which is a sub component of the glass frit. In addition, the glass frit 110 may include oxides which are other components in addition to the main component and the sub component. The oxides may include at least one material or at least two materials selected from the group consisting of $Al_2O_3$, $Ta_2O_5$, $Sb_2O_5$, $ZrO_2$, $HfO_2$, $In_2O_3$, $Ga_2O_3$, $Y_2O_3$, and $Yb_2O_3$.

Figure 3:
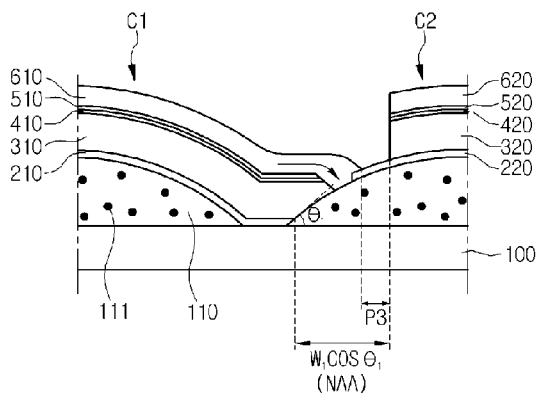
FIG. 3 is a sectional view showing a solar cell module according to the embodiment.

The glass frit 110 may include sodium (Na). For example, the sodium 111 contained in the glass frit 110 may have the form of particles as shown in FIG. 3.

The concentration of the sodium 111 may be in the range of about 10 wt % to about 20 wt % with respect to the glass frit 110. In more detail, the concentration of the sodium 111 may be in the range of about 13 wt % to about 18 wt %, but the embodiment is not limited thereto. The sodium 111 of the glass frit 110 may be dispersed onto the light absorbing layer 300 through the heat treatment process of the manufacturing process of the solar cell. In other words, according to the solar cell of the embodiment, an amount of the sodium 111 diffused into the light absorbing layer 300 can be effectively adjusted by adjusting an amount of the sodium 111 in the glass frit 110. Therefore, according to the solar cell of the embodiment, the open circuit voltage and the fill factor can be improved, so that the photo-electric conversion efficiency of the solar cell can be improved.

In addition, the thermal expansion coefficient of the glass frit 110 is greater than the thermal expansion coefficient of the support substrate 100. Therefore, according to the solar cell of the embodiment, a plurality of glass frits 110 are formed on the support substrate 100, thereby minimizing the bending phenomenon of the support substrate 100 by the heat treatment process of the manufacturing process. Accordingly, the delamination between the support substrate and the solar cell module can be prevented.

In more detail, the first thermal expansion coefficient of the glass frit 110 may be greater than the thermal expansion coefficient of the support substrate 100 by at least $2.0\times10^{-6}$/K. For example, the first thermal expansion coefficient may be in the range of about $8.0\times10^{-6}$/K to about $8.0\times10^{-6}$/K, but the embodiment is not limited thereto.

The glass frit 110 may have various shapes to form a height step on the support substrate 100 as shown in FIG. 2. For example, the sectional shapes of the glass frit 110 may include a polygonal shape such as a triangular shape or a rectangular shape, an oval shape, a hemispherical shape, or a spherical shape.

As shown in FIG. 2, the glass frit 110 has a height step h. For example, the height step h may be in the range of about 1 μm to about 5 mm. In more detail, the height step h may be in the range of about 2 μm to about 4 mm, but the embodiment is not limited thereto.

In addition, the glass frit 110 may be inclined with respect to the support substrate 100. In more detail, the glass frit 110 may have at least one inclination surface with respect to the support substrate 100. For example, the inclination angle θ1 between the glass frit 110 and the support substrate 100 may be in the range of about 10° to about 90°. In more detail, the inclination angle between the glass frit 110 and the support substrate 100 may be in the range of about 10° to about 50°, but the embodiment is not limited thereto.

All of the back electrode layer 200, the light absorbing layer 300, and the front electrode layer 600 provided on the support substrate 100 may have the height step by the glass frit 110.

The back electrode layer 200 is provided on the support substrate 100 and the glass frit 110. Referring to FIG. 2, the back electrode layer 200 may cover portions of the support substrate 100 and the glass frit 110.

The back electrode layer 200 may have a first height step H1 by the glass frit 110. In other words, the back electrode layer 200 includes the form of a thin film having different heights by the glass frit 110. For example, the first height step H1 may be in the range of about 1 um to about 5 mm, but the embodiment is not limited thereto. In more detail, the first height step H1 may be in the range of about 2 μm to about 4 mm, but the embodiment is not limited thereto.

The light absorbing layer 300 is provided on the back electrode layer 200. The light absorbing layer 300 may include a group I-III-VI compound semiconductor. For example, the light absorbing layer 300 may have a $Cu(In,Ga)Se_2$ (CIGS) crystal structure, a $Cu(In)Se_2$ crystal structure, or a $Cu(Ga)Se_2$ crystal structure. The light absorbing layer 300 may have an energy bandgap in the range of about 1 eV to about 1.8 eV.

The light absorbing layer 300 has a second height step H2 by the glass frit 110. In other words, the light absorbing layer 300 may have the form of a thin film having different heights by the glass frit 110. For example, the second height step H2 may be in the range of about 1.5 μm to about 1 mm, but the embodiment is not limited thereto. In more detail, the second height step H2 may be in the range of about 2 mm to about 4 mm, but the embodiment is not limited thereto.

The buffer layer 400 is provided on the light absorbing layer 300. The buffer layer 400 may include CdS, ZnS, $In_xS_y$, or $In_xSe_yZn$ (O, OH). The thickness of the buffer layer 400 may be in the range of about 50 nm to about 150 nm, and the energy bandbap of the buffer layer 400 may be in the range of about 2.2 eV to about 2.4 eV.

The high resistance buffer layer 500 may be provided corresponding to the buffer layer 400. The high resistance buffer layer 500 may include iZnO which is zinc oxide not doped with impurities. The high resistance buffer layer 500 may have an energy bandgap in the range of about 3.1 eV to about 3.3 eV. In addition, the high resistance buffer layer may be omitted. The buffer layer 400 and the high resistance buffer layer 500 may have height steps, respectively, by the glass frit 110.

The front electrode layer 600 may be disposed on the light absorbing layer 300. For example, the front electrode layer 600 may directly make contact with the high resistance buffer layer 500 on the light absorbing layer 300.

The front electrode layer 600 may be formed of a transmitting conductive material. Further, the front electrode layer 600 may have characteristics of an n-type semiconductor. Then, the front electrode layer 600 may form an n-type semiconductor layer together with the buffer layer 400 to form a PN junction with the light absorbing layer 300 which is a p-type semiconductor layer. For example, the front electrode layer 600 may include Al-doped zinc oxide (AZO). The front electrode layer 600 may have a thickness of about 100 nm to about 500 nm.

The front electrode layer 600 may have a third height step H3 by the glass frit 110. In other words, the front electrode layer 600 may have the form of a thin film having different heights by the glass frit 110. For example, the third height step may be in the range of about 1 μm to about 1 mm, but the embodiment is not limited thereto.

FIG. 3 is a sectional view showing a solar cell module according to the embodiment. In other words, the description of the solar cell will be incorporated in the description of the solar cell module.

Referring to FIG. 3, the solar cell module according to the embodiment includes the support substrate 100, the glass frit 110, a first solar cell C1, and a second solar cell C2. Meanwhile, although FIG. 3 shows only two solar cells C1 and C2, the embodiment is not limited thereto. In other words, the solar cell module according to the embodiment may include at least two solar cells.

The first solar cell C1 includes a first back electrode layer 210 provided on the support substrate 100, a first light absorbing layer 310 provided on the first back electrode layer 210, and a first front electrode layer 610 on the first light absorbing layer 310. In more detail, the first solar cell C1 may further include a first buffer layer 410 and a first high resistance buffer layer 510 as shown in FIG. 3.

The second solar cell C2 includes a second back electrode layer 220 provided on glass frits 110, a second light absorbing layer 320 provided on the second back electrode layer 220, and a second front electrode layer 620 provided on the second light absorbing layer 320. The second solar cell C2 may further include a second buffer layer 420 and a second high resistance buffer layer 520 similarly to the structure of the solar cell C2.

The first solar cell C1 is electrically connected to the second solar cell C2. In more detail, the first solar cell C1 and the second solar cell C2 may be electrically connected to each other by the first front electrode layer 610 of the first solar cell C1 and the second back electrode layer 220 of the second solar cell C2. For example, the first and second solar cells C1 and C2 may be electrically connected to each other by allowing the first front electrode layer 610 to make contact with the second back electrode layer 220. In other words, the first front electrode layer 610 and the second back electrode layer 220 may serve as connection electrodes.

As shown in FIG. 3, the first front electrode layer 610 and the second back electrode layer 220 make contact with each other on the glass frit 110. Accordingly, the first and second solar cells C1 and C2 may be electrically connected to each other on the glass frit 110.

In other words, the first front electrode layer 610 formed on the support substrate 100 is connected to the second rear electrode layer 220 formed on the glass frit 110, and the bending of the first front electrode layer 610 may be minimized by the glass frit 110.

In more detail, the first front electrode layer 610 horizontally extends to directly make contact with the second back electrode layer 220. In this case, the first front electrode layer 610 may cover all of the top surface of the second back electrode layer 220 and the lateral side of the second back electrode layer 220.

As described above, according to the solar cell module of the embodiment, the connection electrodes connecting the solar cells to each other may make contact with each other on the substantially same level by the height step of the glass frit 110. In addition, the contact area between the connection electrodes may be more widened. Therefore, according to the solar cell module of the embodiment, the contact resistance caused by the bending of the connection electrode can be reduced, so that the photo-electric efficiency of the solar cell module can be improved.

In addition, according to the solar cell module of the embodiment, a non-active area (NAA) may be reduced by the glass frit 110. Referring to FIG. 1, although the NAA of the conventional solar cell module has a width of W1, the area of the NAA of the solar cell module according to the embodiment may be reduced to W1 X cos θ by the glass frit 110. For example, if the glass frit 110 is inclined at an angle of about 50° with respect to the support substrate, the NAA of the solar cell module according to the embodiment can be reduced by about 35% of the NAA of the conventional solar cell module.

Referring to FIG. 3, the first front electrode layer 210 is spaced apart from the second front electrode layer 220. In addition, the first back electrode layer 610 is spaced apart from the second back electrode layer 620. As the first back electrode layer 610 is spaced apart from the second back electrode layer 620, the solar cell module may be divided into solar cells C1 and C2.

Meanwhile, although not shown in drawings, a polymer resin layer (not shown) and a protective panel (not shown) may be additionally provided on the solar cell module. The polymer resin layer not only can improve the adhesive strength between the solar cell module and the protective panel, but can protect the solar cell module from an external shock. For example, the polymer resin layer may include an ethylene vinylene acetate (EVA) film, but the embodiment is not limited thereto.

The protective panel protects the solar cell module from the external physical shock and/or foreign matters. The protective panel is transparent. For example, the protective panel may include a tempered glass. In this case, the tempered glass may include low iron tempered glass having low iron content.

As described above, the solar cell module according to the embodiment includes a glass frit 110. In addition, the solar cell module according to the embodiment may be formed with a concave convex pattern by the glass frit 110. The solar cell module having the concave convex pattern has an improved adhesive strength with respect to a layer formed on the solar cell module as compared with that of the solar cell module without the concave convex pattern. In other words, according to the solar cell module of the embodiment, the adhesive strength between the solar cell module and the polymer resin layer, or the adhesive strength between the solar cell module and the protective panel can be improved by the concave convex pattern. Accordingly, the stability and the reliability of the solar cell module according to the embodiment can be improved.

FIGS. 4 to 10 are sectional views showing the manufacturing process of the solar cell module according to the embodiment. A method of fabricating the solar cell module will be described by making reference to the above description of the solar cell and the solar cell module.

Figure 4:
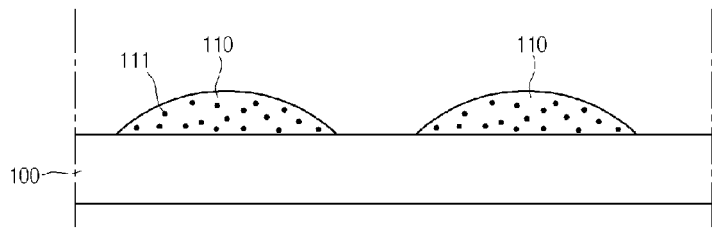
FIGS. 4 to 9 are sectional views showing a method of fabricating the solar cell module.

Referring to FIG. 4, the glass frit 110 containing the sodium 111 is formed on the support substrate 100. In order to form the glass frit 110 according to one embodiment, after preparing a glass paste containing the sodium 111, the glass paste is subject to heat treatment, so that the glass frit 110 may be prepared by using the glass paste.

The glass paste may include the particles of the sodium 111, a glass frit, conductive powders, binders, and a solvent. In addition, the glass paste may include dispersion media to improve the dispersibility of solid components. In this case, the concentration of the sodium 111 may be in the range of 10 w % to 20 w %. In more detail, the concentration of the sodium 111 may be in the range of 13 wt % to 18 wt %, but the embodiment is not limited thereto. In addition, the glass paste may have various compositions and various concentrations of the compositions that are generally known in the art.

The glass paste may be printed or coated on the support substrate 100 through a dip coating, a screen printing scheme, a roll printing scheme, or a table coating scheme.

Thereafter, the glass frit 110 is formed by performing heat treatment with respect to the glass paste. The heat treatment process includes a process of drying the glass paste, a pre-heating process, and a sintering process. The pre-heating process may be performed for about 10 minutes to about 60 minutes at the temperature of about 200° C. to about 400° C., but the embodiment is not limited thereto. In this case, the solvent and an organic material such as a binder constituting the conductive paste can be removed. Thereafter, the conductive paste may be sintered at the temperature of about 450° C. to about 600° C.

Figure 5:
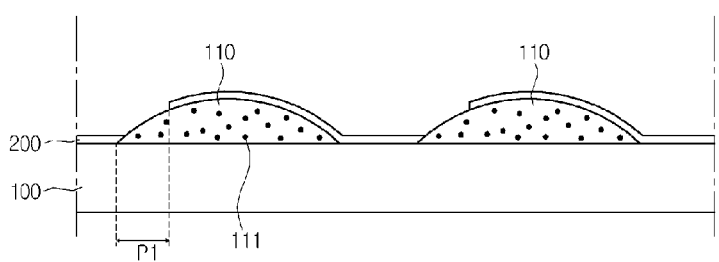

Referring to FIG. 5, the back electrode layer 200 is formed on the support substrate 100 including the glass frit 110. The back electrode layer 200 may be formed by forming a back electrode on the support substrate 100 including the glass frit 110 and forming a first pattern P1 to divide the back electrode. For example, the first pattern P1 may be formed through a photo-lithography process.

The first pattern P1 may be formed on the glass frit 110. In addition, the first pattern P1 may be formed perpendicularly to the support substrate 100, or may be inclined with respect to the support substrate 100.

The back electrode layer 200 has a space formed by the first pattern P1. In other words, the back electrode layer 200 includes a plurality of back electrodes formed by the first pattern P1. The width of the first pattern P1 may be in the range of about 80 μm to about 200 μm, but the embodiment is not limited thereto.

Figure 6:
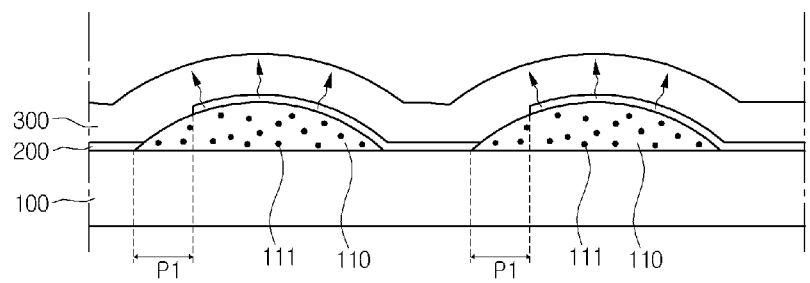

Referring to FIG. 6, the light absorbing layer 300 is formed on the back electrode layer 200.

The light absorbing layer 300 may be formed through a sputtering process or an evaporation scheme. In more detail, in order to form the light absorbing layer 300, a CIG-based metallic precursor layer is formed on the back electrode layer 200 by using a copper target, an indium target, and a gallium target. Thereafter, the metallic precursor layer reacts with selenium through the selenization process, thereby forming the CIGS-based light absorbing layer 300.

In this case, the process of forming the metallic precursor layer and the selenization process are performed at the temperature of about 350° C. to about 550° C., and the sodium 111 contained in the glass frit 110 is dispersed into the light absorbing layer 300.

In other words, the dispersion process of the sodium 111 and the process of forming the light absorbing layer 300 may be simultaneously performed.

Figure 7:
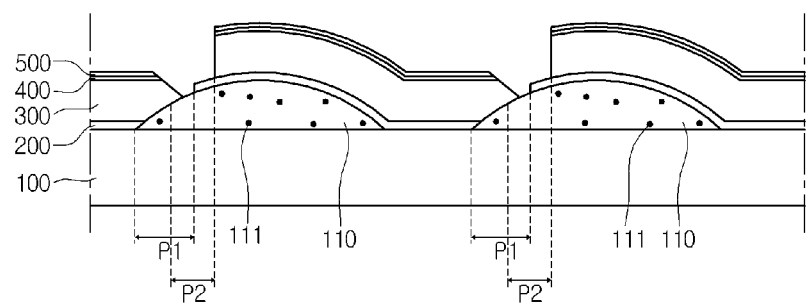

Referring to FIG. 7, the buffer layer 400 and the high resistance buffer layer 500 are formed on the light absorbing layer 300. Thereafter, the second pattern P2 is formed at the light absorbing layer 300, the buffer layer 400, and the high resistance buffer layer 500. The second pattern P2 may be formed on the glass frit 110.

Second patterns P2 may be formed through a mechanical scheme, and exposes a portion of the back electrode layer 200. The width of the second patterns P2 may be in the range of about 80 μm to about 200 μm, but the embodiment is not limited thereto. In addition, the second pattern P2 may be formed perpendicularly to the support substrate 100. In addition, the second pattern P2 may be inclined with respect to the support substrate 100.

Figure 8:
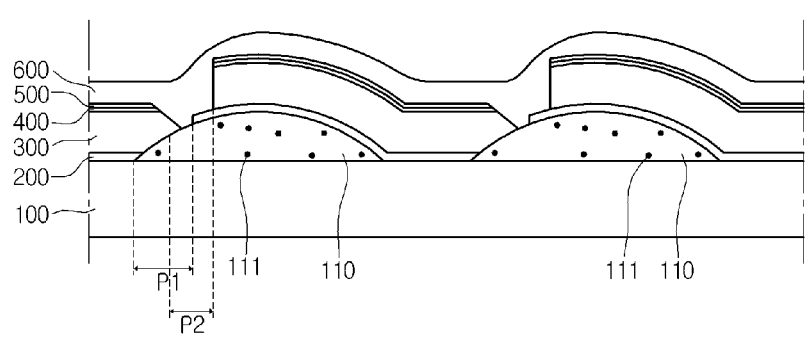
Figure 9:
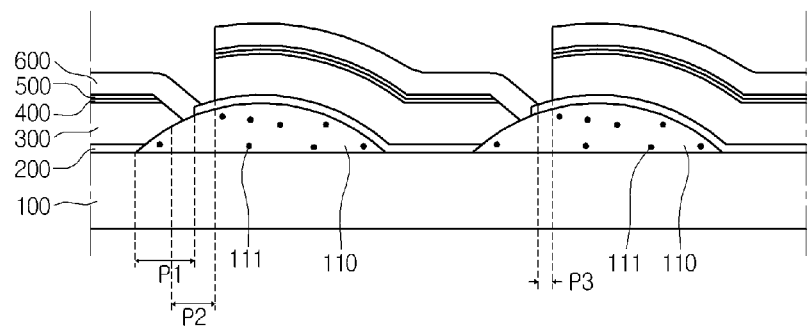

Referring to FIGS. 8 and 9, the front electrode layer 600 is formed by laminating a transparent material on the high resistance buffer layer 500. The front electrode layer 600 may be formed by forming a front electrode on the light absorbing layer 300 and forming a third pattern P3 to divide the front electrode. In addition, third patterns P3 may be mechanically formed, and expose a portion of the back electrode layer 300. For example, the width of the third pattern P3 may be in the range of about 80 μm to about 200 μm, but the embodiment is not limited thereto.

Referring to FIG. 9, the light absorbing layer 300, the buffer layer 400, the high resistance buffer layer 500, and the front electrode layer 600 are perforated by the third patterns P3. In other words, the solar cells C1, C2, . . . , and CN may be defined by the third patterns P3.

The third patterns P3 may be formed on the glass frit 110. In addition, the third patterns P3 may be formed perpendicularly to the support substrate 100. In addition, the third pattern P3 may be inclined with respect to the support substrate 100.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module comprising:
a glass frit provided on a support substrate and including sodium;
a first solar cell comprising a first back electrode layer, a first light absorbing layer, and a first front electrode layer which are sequentially arranged on the support substrate; and
a second solar cell comprising a second back electrode layer, a second light absorbing layer, and a second front electrode layer which are sequentially arranged on the glass frit,
wherein the first solar cell is electrically connected to the second solar cell on the glass frit.

2. The solar cell module of claim 1, wherein the first front electrode layer is electrically connected to the second back electrode layer on the glass frit while directly making contact with the second back electrode layer.

3. The solar cell module of claim 1, wherein one end portion of the first front electrode layer makes contact with a lateral side of the second back electrode layer and a top surface of the second back electrode layer.

4. The solar cell module of claim 1, wherein one end portion of the first front electrode layer horizontally extends to directly make contact with the second back electrode layer.

5. The solar cell module of claim 1, wherein the first front electrode layer is spaced apart from the second front electrode layer.

6. The solar cell module of claim 1, wherein the first back electrode layer is spaced apart from the second back electrode layer.

7. A solar cell comprising:
a glass fit provided on a support substrate and including sodium;
a back electrode layer provided on the support substrate and the glass frit and having a first height step;
a light absorbing layer provided on the back electrode layer and having a second height step; and
a front electrode layer provided on the light absorbing layer and having a third height step.

8. The solar cell of claim 7, wherein the sodium has a concentration in a range of about 10 wt % to about 20 wt %.

9. The solar cell of claim 7, wherein a first thermal expansion coefficient of the glass frit is greater than a second thermal expansion coefficient of the support substrate.

10. The solar cell of claim 9, wherein the first thermal expansion coefficient is greater than the second thermal expansion coefficient by at least $2.0 \times 10^{-6}$/K.

11. The solar cell of claim 9, wherein the first thermal expansion coefficient is in a range of $8.0 \times 10^{-6}$/K to $10.0 \times 10^{-6}$/K.

12. The solar cell of claim 7, wherein the glass frit has a height in a range of about 1 μm to about 5 mm.

13. The solar cell of claim 7, wherein the glass frit is inclined with respect to the support substrate, and an inclination angle is in a range of about 10° to about 50°.

14. The solar cell of claim 7, wherein the first height step is in a range of about 1 um to about 5 mm, the second height step is in a range of 1.5 μm to 1 mm, and the third height step is in a range of 1.5 μm to 1 ml.

15. The solar cell of claim 7, wherein the sodium has a concentration in a range of about 10 wt % to about 20 wt %.

16. The solar cell of claim 7, wherein the sodium has a concentration in a range of about 13 wt % to about 18 wt %.

17. The solar cell of claim 7, wherein a first thermal expansion coefficient of the glass frit is greater than a second thermal expansion coefficient of the support substrate.

18. The solar cell of claim 7, wherein the first thermal expansion coefficient is greater than the second thermal expansion coefficient by at least $2.0 \times 10^{-6}$/K.

19. The solar cell of claim 7, wherein the first thermal expansion coefficient is in a range of $8.0 \times 10^{-6}$/K to $10.0 \times 10^{-6}$/K.

20. The solar cell of claim 7, wherein the glass frit includes $SiO_2$-based material, $SiO_2$—ZnO (Si—Zn—O)-based material, $SiO_2$—$B_2O_3$(Si—B—O)-based material, or $SiO_2$—$Bi_2O_3$ (Si—Bi—O)-based material.

* * * * *